(12) United States Patent
Gruber et al.

(10) Patent No.: US 7,764,530 B2
(45) Date of Patent: *Jul. 27, 2010

(54) MEMORY CIRCUIT ARRANGEMENT AND METHOD FOR THE PRODUCTION THEREOF

(75) Inventors: Wolfgang Gruber, Neu-Esting (DE); Ronald Kakoschke, München (DE); Thomas Schwelzer, Ebersberg (DE); Dominik Wegertseder, Haar (DE)

(73) Assignee: Infineon Technologies AG, Munich (DE)

( * ) Notice: Subject to any disclaimer, the term of this patent is extended or adjusted under 35 U.S.C. 154(b) by 10 days.

This patent is subject to a terminal disclaimer.

(21) Appl. No.: 12/258,728

(22) Filed: Oct. 27, 2008

(65) Prior Publication Data

US 2009/0052219 A1    Feb. 26, 2009

Related U.S. Application Data

(63) Continuation of application No. 11/251,355, filed on Oct. 14, 2005, which is a continuation of application No. PCT/EP2004/050322, filed on Mar. 17, 2004, now Pat. No. 7,460,385.

(30) Foreign Application Priority Data

Apr. 29, 2003   (DE) ................. 103 19 271

(51) Int. Cl.
  *G11C 5/06*   (2006.01)
  *G11C 5/02*   (2006.01)
  *H01L 21/00*  (2006.01)
(52) U.S. Cl. ................. 365/51; 365/63; 438/107; 257/E25.03; 257/E23.062

(58) Field of Classification Search ................. 365/51, 365/63, 185.05; 438/107, 406, 455; 257/455, 257/E25.03, E23.062, E23.169, E23.173
See application file for complete search history.

(56) References Cited

U.S. PATENT DOCUMENTS 5,386,623 A    2/1995  Okamoto et al.

(Continued)

FOREIGN PATENT DOCUMENTS

DE    198 19 542 A1    11/1999

(Continued)

OTHER PUBLICATIONS

Translation of Japanese Decision of Refusal; Jan. 13, 2009.

(Continued)

*Primary Examiner*—J. H. Hur
(74) *Attorney, Agent, or Firm*—Brinks Hofer Gilson & Lione

(57) ABSTRACT

A memory circuit arrangement and fabrication method thereof are presented in which the parts of the memory circuit arrangement are situated on two different substrates. An integrated memory cell array is situated on one substrate. An integrated control circuit that controls access to the memory cells is situated on the other (logic circuit) substrate. The control circuit controls sequences when reading, writing or erasing content of a memory cell. The logic circuit substrate also contains a CPU and encryption coprocessor. The memory circuit contains a sense amplifier, with the aid of which the memory state of a memory cell can be determined, and a decoding circuit that selects a word or bit line.

15 Claims, 3 Drawing Sheets

U.S. PATENT DOCUMENTS

| | | | |
|---|---|---|---|
| 5,760,478 | A | 6/1998 | Bozso et al. |
| 5,838,603 | A * | 11/1998 | Mori et al. .................... 365/63 |
| 6,414,300 | B1 | 7/2002 | Mazure-Espejo et al. |
| 6,768,163 | B2 | 7/2004 | Tanaka et al. |
| 7,460,385 | B2 * | 12/2008 | Gruber et al. ................. 365/51 |
| 2001/0053223 | A1 * | 12/2001 | Ishibashi et al. ............ 380/231 |
| 2002/0017667 | A1 | 2/2002 | Shimoda et al. |
| 2002/0050634 | A1 * | 5/2002 | Han ........................... 257/686 |
| 2004/0056682 | A1 * | 3/2004 | Wada ........................... 326/68 |

FOREIGN PATENT DOCUMENTS

| | | |
|---|---|---|
| DE | 697 15 762 T2 | 4/2003 |
| JP | 08-167703 | 6/1996 |
| JP | 2002-026280 | 1/2002 |
| JP | 2002-043504 | 2/2002 |
| JP | 2002 110899 | 4/2002 |

OTHER PUBLICATIONS

Martin Goetz, "System on Chip Design Methodology Applied to System in Package Architecture", pp. 254-258, 2002 Electronic Components and Technology Conference.

Michael Wang, Katsuharu Suzuki, Wayne Dai, Atsushi Sakai, Kiwamu Watanabe, "Configurable Area-IO Memory for System-in-a-Package (SiP)", pp. 254-258, 2001.

Examination Report issued in counterpart Japanese application No. 2006-500119 on May 7, 2008.

* cited by examiner

MEMORY CIRCUIT ARRANGEMENT AND METHOD FOR THE PRODUCTION THEREOF

PRIORITY CLAIM

This application is a continuation application of Ser. No. 11/251,355 now U.S. Pat. No. 7,460,385 filed Oct. 14, 2005, which is a continuation of International Application PCT/EP2004/050322, filed on Mar. 17, 2004, which claims the benefit of priority to German Patent Application DE 10 2003 10319271.9 filed on Apr. 29, 2003, all of which are herein incorporated by reference in their entirety.

TECHNICAL FIELD

The present invention relates to a memory circuit arrangement having a substrate for a memory cell array and having a substrate for a logic circuit for driving the memory cell array.

BACKGROUND

In memory circuit arrangements, two kinds of memory circuits exist: nonvolatile memory circuits and volatile memory circuits. Nonvolatile memory circuits return their memory content even after a supply voltage of the memory circuit has been switched off. Examples of nonvolatile memory circuits include ROM circuits (Read Only Memory) or EEPROM circuits (Electrically Erasable Programmable Read Only Memory). Volatile memory circuits lose their memory content after a supply voltage for the memory circuit has been switched off. Examples of volatile memory circuits include DRAM circuits (Dynamic Random Access Memory) or SRAM circuits (Static Random Access Memory).

What is common to these memory circuits is that both the memory cell array and the logic circuit are situated on one substrate, e.g. on a semiconductor substrate, in particular on a silicon substrate, see DE 198 19 542, by way of example. In so-called embedded systems, the memory circuit arrangements are fabricated together with a processor on one substrate. On the other hand, there are also so-called system-in-package circuits, in the case of which a memory chip and a processor chip are arranged in a circuit housing. In the case of so-called multi-chip modules, too, one circuit contains a plurality of "standard" circuits, e.g. a memory circuit and a processor circuit.

However, fabrication of memory circuit arrangements is relatively complicated and thus costly. Accordingly, a memory circuit arrangement that can be produced simply and cost-effectively is desirable.

SUMMARY

By way of introduction only, a memory circuit arrangement and simple and cost-effective method of fabrication thereof is presented.

In one embodiment, a memory circuit arrangement comprises a cell array substrate and a logic circuit substrate that is a different substrate than the cell array substrate. The cell array substrate has an integrated memory cell array contained in a memory circuit. The integrated memory cell array includes memory cells. The logic circuit substrate has an integrated logic circuit that controls access to the memory cells. The logic circuit includes a control circuit contained in the memory circuit, the control circuit controlling sequences when at least one of reading or writing content of a memory cell of the memory cell array, and/or a decoding circuit contained in the memory circuit, the decoding circuit selects, in a manner dependent on an address datum, a word line or a bit line connected to a plurality of memory cells of the memory cell array.

In another embodiment, a method for producing an integrated circuit arrangement is presented, in which the following steps are performed without any restriction by the order specified: fabricating an integrated memory cell array on a memory cell array substrate using a first sequence of method steps; fabricating an integrated logic circuit that provide basic functions of the memory cell array on a logic circuit substrate, which is separate from the memory cell substrate, using a second sequence of method steps, which differs from the first sequence; and arranging the integrated memory cell array and the integrated logic circuit to form a memory circuit arrangement. The logic circuit includes a control circuit contained in the memory circuit, the control circuit controlling sequences when at least one of reading or writing content of a memory cell of the memory cell array, and/or a decoding circuit contained in the memory circuit, the decoding circuit selects, in a manner dependent on an address datum, a word line or a bit line connected to a plurality of memory cells of the memory cell array.

The foregoing summary has been provided only by way of introduction. Nothing in this section should be taken as a limitation on the following claims, which define the scope of the invention.

BRIEF DESCRIPTION OF THE FIGURES

The application will be described below in greater detail on the basis of preferred embodiments and with reference to the accompanying drawings, in which.

DETAILED DESCRIPTION

Figure 1:
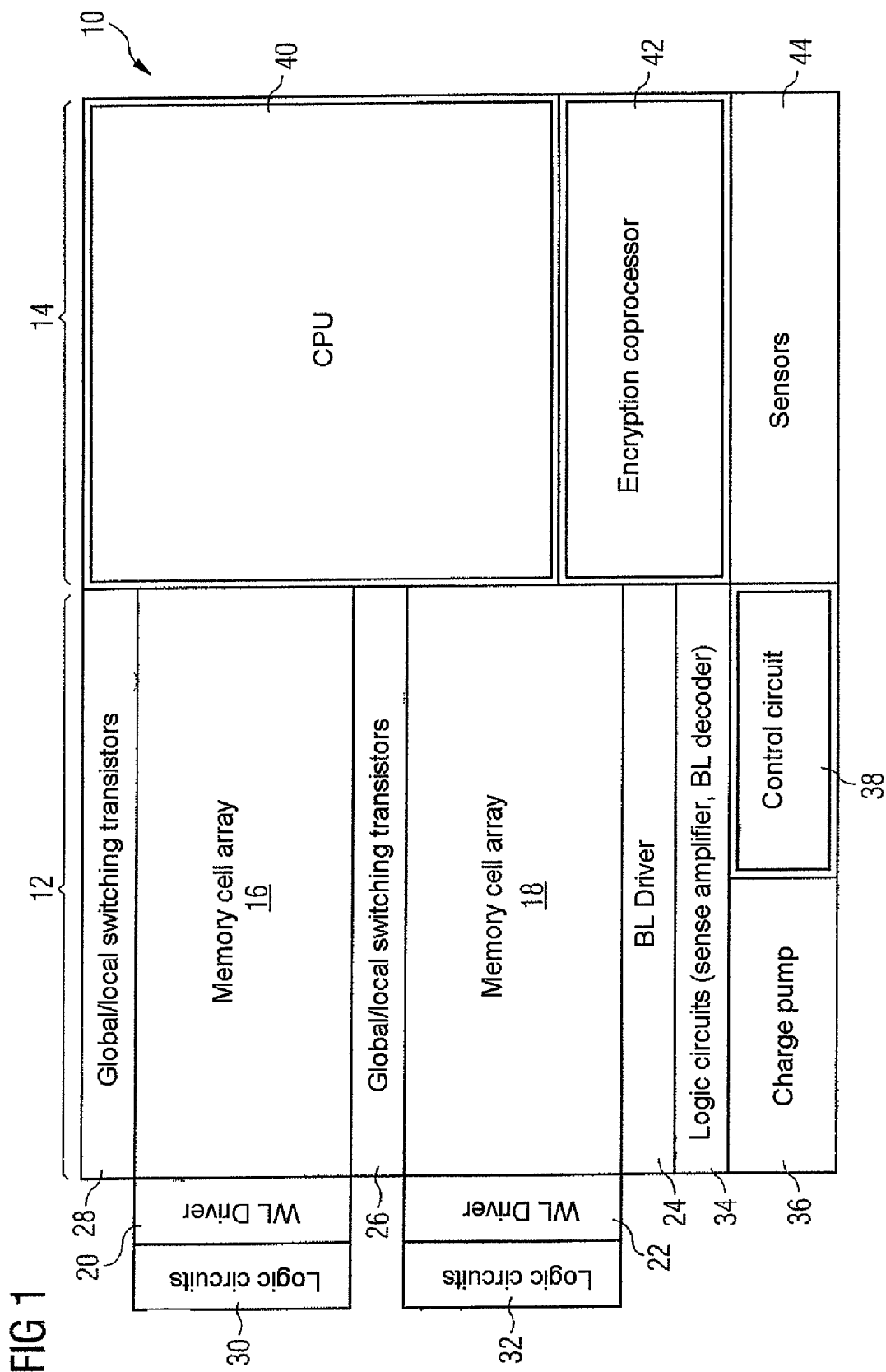
FIG. 1 shows the division of circuit parts of a circuit arrangement between two substrates with a small number of connecting locations between the substrates.

The overall production outlay depends on the outlay for the production of a specific chip area in a memory circuit arrangement. By virtue of a skilful division of the units of a memory circuit arrangement, for example, on account of technological considerations, it is possible to achieve, in a simple manner, a considerable reduction of the production costs per chip area, even when taking account of an additional assembly outlay with which the separately fabricated constituent parts are connected to one another. By way of example, if the number of method steps for producing a sub circuit decreases by a third in comparison with the production of the memory circuit arrangement on only a single substrate, then the method implementation becomes considerably simpler. The production outlay relating to a chip area is then reduced for each subcircuit for example by more than half in comparison with the production outlay per chip area when producing the memory circuit arrangement on a single substrate. Addition of the production outlay for the two partial chip areas results in a production outlay that is considerably less than the production outlay which results if the integrated circuit arrangement is produced on only one substrate.

Therefore, the memory circuit arrangement is presented that contains a cell array substrate, which carries an integrated memory cell array comprising a multiplicity of memory cells. Each memory cell contains at least one transistor, e.g. a floating gate transistor, or alternatively a transistor and a storage capacitor. Moreover, the memory circuit arrangement contains a logic circuit substrate, which carries at least one integrated logic circuit for controlling the access to the memory cells in the context of the basic functions of the memory circuit arrangement. The basic functions include reading, writing or erasing the content of one or more memory cells of the memory cell array. In one configuration, a selection of specific memory cells of the memory cell array in a manner dependent on an address datum present at the memory circuit also concerns the basic function of the memory circuit arrangement.

In one embodiment, the logic circuit substrate is a different substrate than the cell array substrate. In particular, the integrated circuit arrangements arranged on the two substrates have been fabricated in mutually separate production methods.

In one embodiment, the cell array substrate has substrate surfaces which surround only the cell array substrate and not the logic circuit substrate on all sides. Conversely, the logic circuit substrate has substrate surfaces which surround only the logic circuit substrate and not the cell array substrate on all sides. The substrate surfaces are, in particular, separating areas or polished separating areas.

In another embodiment, the memory cells of the memory cell array are volatile memory cells. In an alternative development, the memory cells of the memory cell array are nonvolatile memory cells, such as flash memory cells, in the case of which a multiplicity of memory cells are erased during each erasing operation. Nonvolatile memory cells exhibit considerable technological differences in the production of the cell array and in the production of peripheral circuits. The differences become greater with smaller minimum feature sizes and with the utilization of new memory principles, for example in the case of ferroelectric or magnetoresistive memory cells or in the case of memory cells that utilize a change between an amorphous and a crystalline phase for storage.

The logic circuit substrate may carry a control circuit, which controls sequences when reading, sequences when writing to, and sequences when erasing a memory cell of the memory cell array. In particular, the sequence of control signals is ensured by means of the control circuit. By way of example, for NOR type nonvolatile memory circuits, the control circuit is referred to as FACE (Flash Algorithmic Control Engine). Similar central control circuits for controlling the function of the memory circuit are present for NAND and other types of integrated circuits.

The logic circuit substrate may contain a sense amplifier circuit, with the aid of which the memory state of a memory cell can be determined. The logic circuit substrate may also contain at least one decoding circuit which selects, from an address datum, a collective line that is connected to a plurality of memory cells of the memory cell array, but not to all the memory cells of the memory cell array. A collective line connected to memory cells of a row of memory cells of the memory cell array is also referred to as a word line. The word lines are connected e.g. to the gate electrodes of transistors of the memory cells. A collective line connected to memory cells of a column of memory cells of the memory cell array is also referred to as a bit line. The bit lines are connected e.g. to the source/drain zones of field effect transistors of the memory cells. Moreover, electrically conductive connections are present between the cell array substrate and the logic circuit substrate for each collective line. These connections can be a soldering connection, an adhesive connection, a welding connection, a bonding connection, a connection produced by curing a mixture containing a solvent, for example in accordance with EP 0 610 709 A1, or a metallization connection penetrating through the entire thickness of the memory cell substrate or the entire thickness of the logic circuit substrate, as shown in, for example, DE 199 04 751 C1.

In this case, the number of connections between the substrates depends on the number of word lines and/or the number of bit lines. Thus, by way of example, the number of connections is more than 1000, more than 2000 or more than 3000, depending on the storage capacity of the memory cell array.

The logic circuit substrate may carry a circuit arrangement of at least one processor which is suitable for processing program instructions, in particular for processing program instructions stored in the memory cell array. The processor contains, inter alia, an arithmetic logic unit and a control unit, in which a micro program, for example, is executed. In this case, the logic circuit substrate may contain a circuit arrangement for two processors, namely for a main processor and a coprocessor. The coprocessor is, for example, a processor that executes an encryption algorithm for encrypting data. In one configuration, a circuit arrangement having a memory circuit arrangement, processor and coprocessor is incorporated into a so-called smart card having a thickness of less than 2 mm.

The cell array substrate may carry at least one sensor, for example, a voltage sensor or a current sensor. The cell array substrate may contain an analog-to-digital converter, for example for converting the analog output signals generated by a sensor into a digital datum.

A main area of the cell array substrate and a main area of the logic circuit substrate may lie in two planes parallel to one another, preferably with overlapping in the direction of the normal to one main area. In this case, a main area, in contrast to an edge area, is an area containing a considerably larger amount of area than the edge area. In this development, the two substrates and, if appropriate, also further substrates of the circuit arrangement are stacked one above the other. In contrast to previous stacks of substrates, however, in the case of the development, assemblies of a memory circuit arrangement lie on different substrates of the substrate stack.

As an alternative, it is also possible to use a carrier substrate on which, by way of example, a plurality of substrates situated transversely with respect to the carrier substrate are lined up. In this case, a main area of the cell array substrate is situated transversely with respect to a main area of the logic circuit substrate.

A method for producing the memory circuit arrangement includes fabricating an integrated memory cell array on a memory cell substrate by means of a first sequence of method steps, fabricating an integrated logic circuit for providing basic functions of the memory cell array on a logic circuit substrate separate from the memory cell substrate, by means of a second sequence of method steps, which differs from the first sequence, and arranging the integrated memory cell array and the integrated circuit arrangement to form a memory circuit arrangement.

In particular, the two sequences of method steps relate to different production technologies, for example production technologies with mutually different minimum feature sizes.

The first sequence of method steps can be performed before the second sequence of method steps is carried out. Conversely, however, it is also possible for the second sequence of method steps to be carried out before the first sequence of method steps. It is also possible to simultaneously carry out the two sequences of method steps at the same production site or at different production sites. When said sequences of method steps are carried out at the same production site, e.g. different machines are used for method steps of the two methods. When the same machines are utilized, the method steps of different sequences are performed in succession.

In one embodiment, the first sequence contains method steps which are particularly suitable for the production of a memory cell array and which are not required in the production of the logic circuit. Similarly, the second sequence may contain method steps which are particularly suitable for the production of logic circuits and which are not required in the production of a memory cell array. This procedure gives rise to a method which comprises two partial methods and the production outlay of which in total is less than a method in which both the memory cell array and the logic circuit have to be produced by means of the same technology or in which, with regard to the logic circuit or to the memory cell array, specific compromises have to be made in the production of the memory cell array or in the production of the logic circuit, respectively.

Turning now to the figures, FIG. 1 shows circuit blocks of a circuit arrangement 10. Circuit blocks of a memory circuit are situated in a left-hand part 12 of the circuit arrangement 10. Additional circuits that are provided in addition to the memory circuit in the circuit arrangement 10 are situated in a right-hand part 14 of the circuit arrangement 10. However, the additional circuits utilize the memory circuit during operation of the circuit arrangement 10.

The memory circuit is, for example a memory circuit having memory cells that store charge in nonvolatile fashion or having memory cells that store charge in volatile fashion. In the exemplary embodiment, the memory circuit contains two or more memory cell arrays 16, 18 in which memory cells are arranged in rows and columns in a matrix-type manner. Memory cells of a row are connected by word lines leading to word line driver transistors 20, 22 at the left-hand edge of the memory cell array 16 and 18, respectively. Bit lines, on the other hand, connect the memory cells of a column of a memory cell array 16 and 18, respectively, and lead to bit line driver transistors 24 at the lower edge of the memory cell array 18. The driver transistors 20 to 24 serve for level conversion.

A switching transistor group 26 is arranged between the two memory cell arrays 16 and 18. A further switching transistor group 28 is situated above the memory cell array 16. The switching transistors of the switching transistor groups 26 and 28 serve for the connection of internal bit lines in a memory cell array, or so-called local bit lines, to bit lines that run over or through a plurality of memory cell arrays 16, 18. The word line driver transistors 20 and the word line driver transistors 22 are driven by a word line decoding circuit 30 and by a word line decoding circuit 32, respectively. The decoding circuit 30 and 32 selects a word line in a manner dependent on an address datum for specifying a word line, for example by the application of a voltage only to the selected word line.

The bit line driver transistors 24 are driven by a bit line decoding circuit, which selects a bit line in a manner dependent on an address datum for designating a bit line. The bit line decoding circuit is one of a plurality of logic circuits 34 for providing the basic functions of the memory circuit. The logic circuits 34 also include, by way of example, a so-called sense amplifier, with the aid of which the memory state of a memory cell can be determined.

The memory circuit furthermore includes a charge pump 36, which can be used to generate voltages required for erasing or writing to the memory cells of the memory cell array. Moreover, the memory circuit contains, for providing its basic functions, a control circuit 38, which performs superordinate control functions in the memory circuit. This control includes, for example, control of programming, reading and/or erasing, and control of the decoding circuits 30, 32, of the logic circuits 34 and/or of the charge pump 36.

The right-hand part of the circuit arrangement 10 contains, in the exemplary embodiment: a processor 40, for example constructed like a commercially available microprocessor, an encryption coprocessor 42, which operates for example in accordance with the RSA algorithm (Revist, Schamir and Adlemann) or in accordance with the DES algorithm (Data Encryption Standard), and a sensor array 44 having a plurality of current and voltage sensors and also having a plurality of analog-to-digital converters for converting the analog sensor signals into digital data.

In accordance with a first exemplary embodiment, the circuit blocks of the circuit arrangement 10 that are illustrated in FIG. 1 are divided between two different substrates such that one substrate carries the sensor array 44 and all parts of the memory circuit apart from the control circuit 38, that is to say all of the function blocks framed by only a single border in FIG. 1, namely: the memory cell arrays 16, 18, the word line driver transistors 20, 22, the bit line driver transistors 24, the word line decoding circuits 30, 32, the logic circuits 34, the charge pump 36, and the sensors and converters of the sensor array 44. By contrast, in the first exemplary embodiment, the second substrate carries the function blocks surrounded by a double frame in FIG. 1, namely: the control circuit 38, the processor 40, and the encryption coprocessor 42.

Thus, only the control circuit 38 of the memory circuit is situated on the second substrate, so that only a comparably small number of electrically conductive connections have to be produced between the circuits on the two substrates, for example fewer than 100 connections, e.g. so-called soldering bumps. Bulk substrates or SOI substrates (silicon on insulator) may be used.

Figure 2:
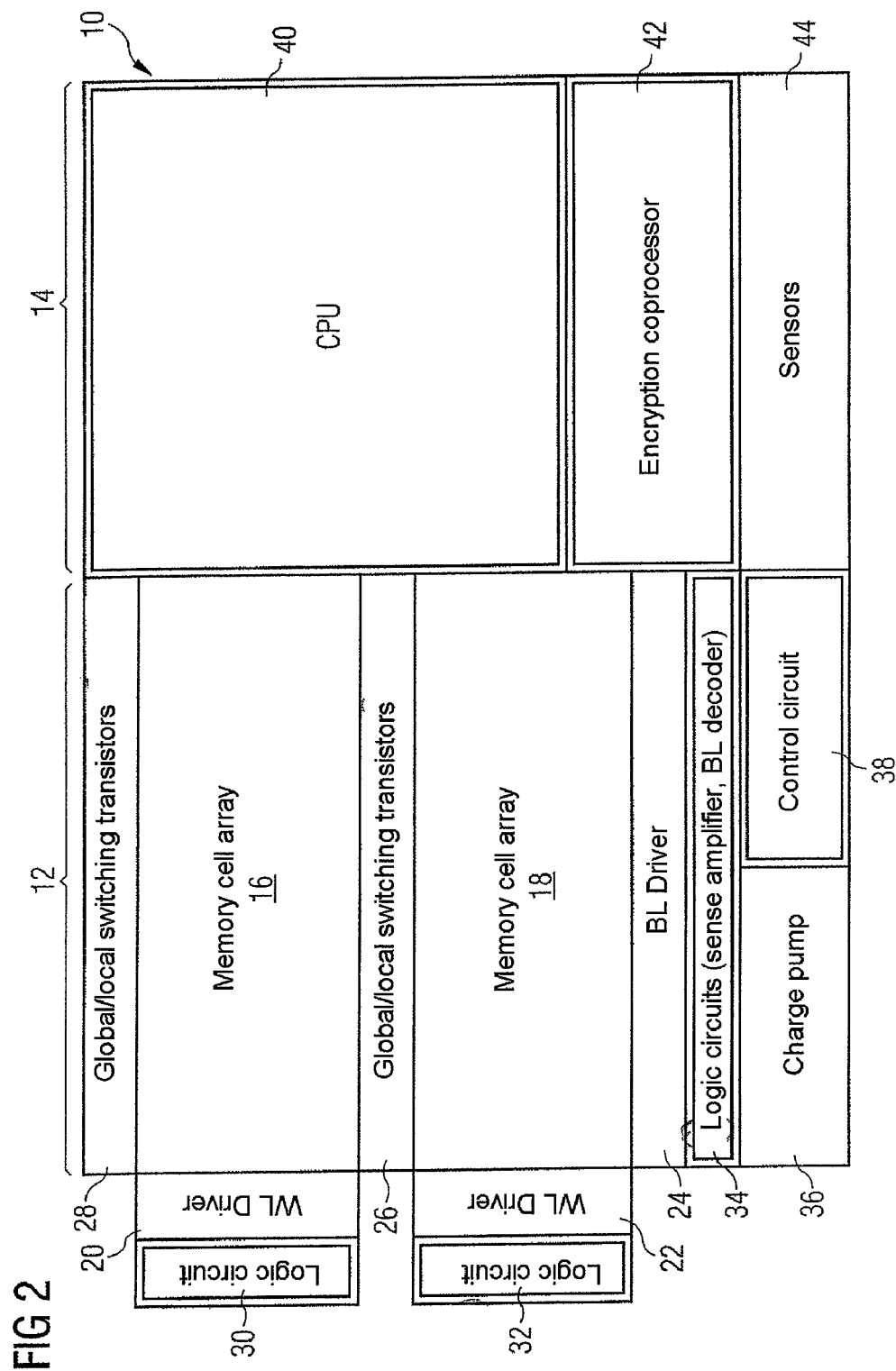
FIG. 2 shows the division of circuit parts of a circuit arrangement between two substrates with a multiplicity of connecting locations between word lines and bit lines.

FIG. 2 shows a division of the function blocks of the circuit arrangement 10 between two substrates in accordance with a second exemplary embodiment. In the second exemplary embodiment, one substrate contains the function blocks of the circuit arrangement 10 that are surrounded by a single frame in FIG. 2, namely: the memory cell arrays 16, 18, the word line driver transistors 20, 22, the bit line driver transistors 24, the charge pump 36, and the sensors and converters of the sensor array 44. By contrast, in accordance with the second exemplary embodiment, the second substrate contains the function blocks surrounded by a double frame in FIG. 2, namely: the word line decoding circuits 30, 32, the logic circuits 34, the control circuit 38, the processor 40, and the encryption coprocessor 42.

In the second exemplary embodiment, the number of connections between the two substrates is very large, since each word line and each bit line of the memory circuit is assigned a connection. By way of example, several thousand connections connect the two substrates.

Figure 3:
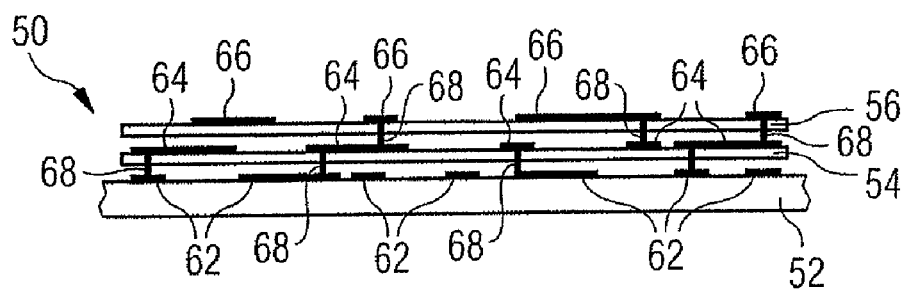
FIG. 3 shows a cross section through a substrate stack having three substrates during the production of a circuit arrangement.

FIG. 3 shows a cross section through a substrate stack 50 during the production of a circuit arrangement containing, by way of example, function blocks that are identical or similar to those of the circuit arrangement 10. The substrate stack 50 contains a lower bottom substrate 52, an intermediate substrate 54 arranged above the bottom substrate 52, and a top substrate 56 arranged above the intermediate substrate. In the case of the production state illustrated in FIG. 3, the bottom substrate 52 is still part of a semiconductor wafer containing a multiplicity of bottom substrates 52 which are separated from one another at the end of the production process. By way of example, the bottom substrate 52 is at least twice as thick as the intermediate substrate 54 or the top substrate 56. In a first exemplary embodiment, the intermediate substrate 54 and the top substrate 56 have already been singulated. In another exemplary embodiment, the intermediate substrate 54 is part of a semiconductor wafer carrying a multiplicity of intermediate substrates 54. The top substrate 56 is part of a semiconductor wafer carrying a multiplicity of top substrates 56. In this case, the intermediate substrate 54 and the top substrate 56 are singulated together with the bottom substrate 52.

The bottom substrate 52, the intermediate substrate 54 and the top substrate 56 carry interconnects 62, 64 and 66, respectively. In the exemplary embodiment, the interconnects 62, 64 and 66 are situated on the upper area of the bottom substrate 52, of the intermediate substrate 54 and of the top substrate 56, respectively. In other exemplary embodiments, there are a plurality of layers of interconnects in each substrate. In a further exemplary embodiment, interconnects are also situated on the rear sides of the bottom substrate, of the intermediate substrate and/or of the top substrate 56. The interconnects of different substrates 52 to 56 are interconnected by vertical metallizations 68, for example by a metallization between the bottom substrate 52 and the intermediate substrate 54 or by a metallization (not illustrated) between the top substrate 56 and the bottom substrate 52.

An insulating spacing, filled for example by a solid dielectric, for example by silicon dioxide, is situated between the bottom substrate 52 and the intermediate substrate 54 and also between the intermediate substrate 54 and the top substrate 56. Parts of a memory circuit are situated on the bottom substrate 52, for example. Other parts of the same memory circuit are situated on the intermediate substrate 54, by contrast.

Figure 4:
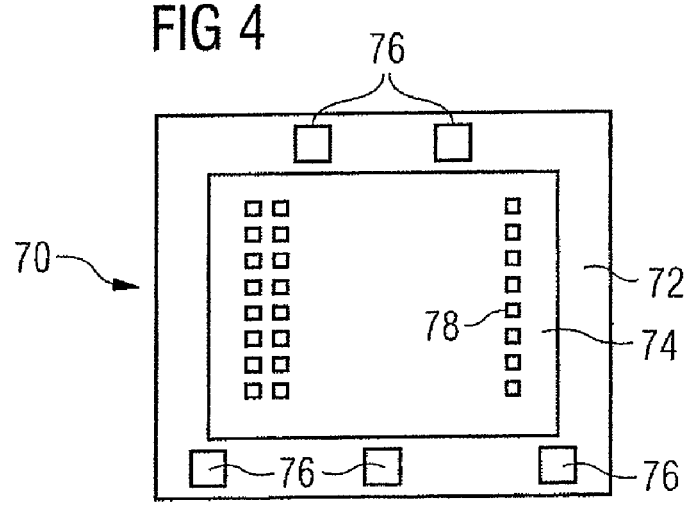
FIG. 4 shows a plan view of a substrate stack having two substrates connected by means of a rapid chip mounting technique.

FIG. 4 shows a plan view of a layer stack 70 containing a bottom substrate 72 and a top substrate 74 arranged thereabove. Further substrates are not contained in the layer stack 70. By way of example, the function blocks framed by a single border in FIG. 1 are situated on the bottom substrate 72 and the function blocks framed by a double border in FIG. 1 are situated on the top substrate 74. Along its periphery, the bottom substrate 72 carries bonding islands 76 for the connection of bonding wires which are intended to lead to connection pins of a housing for the encapsulation of the layer stack 70. The bonding islands 76 have, for example, a length of greater than 50 µm (micrometers) and a width of greater than 50 µm, typically of 100 µm in each case.

Situated between the bottom substrate 72 and the top substrate 74 are e.g. three rows of soldering connections 78, a total of 24 soldering connections 78 in the exemplary embodiment. The soldering connections 78 end on soldering islands which, by way of example, have a width of less than 20 µm and a length of less than 20 µm, typically a size of 10 µm×10 µm. The soldering connections 78 are produced in the context of a rapid chip mounting technique, also referred to as flip-chip technique or as face-to-face technique.

Figure 5:
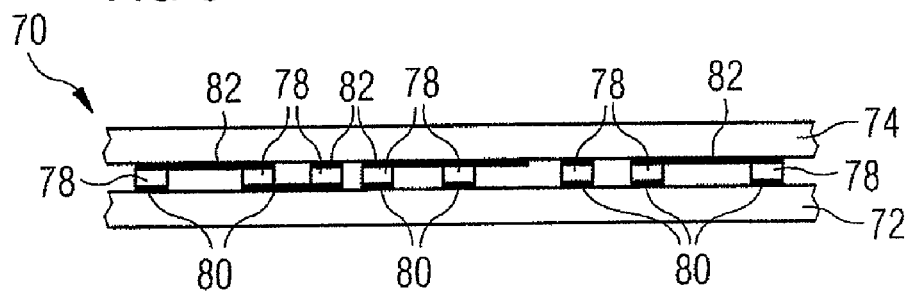
FIG. 5 shows a cross section through the substrate stack having two substrates.

FIG. 5 shows a cross section through the substrate stack 70 along a series of soldering connections 78. Interconnects 80 carried by the bottom substrate 72 are situated opposite interconnects 82 carried by the top substrate 74.

In other exemplary embodiments, the function blocks of the circuit arrangement 10 are divided between the two substrates in a different manner than that explained above. In further exemplary embodiments, the circuit arrangement 10 also contains other function blocks.

The production methods explained above can be used highly beneficially in particular when technologies with minimum feature sizes of less than 250 nm (nanometers) and in particular less than or equal to 65 nm are produced.

Accordingly, a circuit arrangement which has hitherto been produced on one chip is divided into two or more partial chips optimally with regard to the production outlay. The partial chips are then connected through three-dimensional integration. The performance of the product remains the same or is even increased. The selection criterion is chosen such that each partial chip contains only a limited number of mutually different components.

The table below shows a comparison of process steps between an embedded process listed in column 1, in which a nonvolatile memory circuit with a processor is arranged on one chip, and the method presented herein listed in columns 2 and 3, in which two partial chips are produced and connected later.

TABLE 1

| Column 1 (embedded) | Column 2 (memory) | Column 3 (logic) |
|---|---|---|
| STI (shallow trench insulation) | DTI (deep trench insulation) | STI (shallow trench insulation) |
| High-voltage (HV) n-type well | High-voltage (HV) n-type well | |
| HV p-type well | HV p-type well | |
| Medium-voltage (MV) Vt implantation | Medium-voltage (MV) Vt implantation | |
| Tunnel window | Tunnel window | |
| Floating gate (FG) | Floating gate (FG) | |
| LG-region by region removal of the FG's | LG-region by region removal of the FG's | |
| n-type well | | n-type well |
| p-type well | | p-type well |
| Dual gate oxide | Dual gate oxide | |
| Stacked gate etch | Stacked gate etch | |
| Matrix implantation | Matrix implantation | |
| Gate patterning | Gate patterning | Gate patterning |
| HV-n-LDD (low doped drain) | HV-n-LDD (low doped drain) | |
| HV-p-LDD (low doped drain) | HV-p-LDD (low doped drain) | |
| Logic NFET channel connection (extension) | | Logic NFET channel connection (extension) |
| Logic PFET channel connection | | Logic PFET channel connection |
| n+ source/drain | n+ source/drain | n+ source/drain |
| p+ source/drain | p+ source/drain | p+ source/drain |
| Silicide blocking | Silicide blocking | Silicide blocking |
| Contact | Contact | Contact |
| Metal 1 | Metal 1 | Metal 1 |
| Metal 2 | Metal 2 | Metal 2 |
| Via 1 | Via 1 | Via 1 |
| Metal 3 | metal 3 | Metal 3 |
| Via 2 | Via 2 | Via 2 |
| Metal 4 | Metal 4 | Metal 4 |
| Via 3 | Via 3 | Via 3 |
| Via last copper layer to the interconnect | | Via last copper layer to the interconnect |
| AlCu transfer pad | | AlCu transfer pad |
| TV (opening of the passivation to the connection pads) | | TV (opening of the passivation to the connection pads) |

The processes in accordance with columns 2 and 3 of the table are less complex than the process in accordance with column 1 when considered by themselves in each case and also when considered altogether. The processes in accordance with columns 2 and 3 may be carried out at different production sites.

By way of example, the production—optimized for rapidity—of the nonvolatile circuit in accordance with column 2 with an aluminum metallization and an oxide intermetal dielectric is carried out at a production site A. By contrast, the production of the logic circuit in accordance with column 3 with copper metallization and a dielectric having a low dielectric constant of less than 3.9 is carried out at a production site B. This procedure results in a considerable reduction in costs compared with the method in accordance with column 1. Moreover, in the case of the partial chip for the memory circuit, it is possible to use deep trench isolations for optimizing the area taken up. Such deep trenches cannot readily be produced together with the shallow trench isolations required for the logic circuit. Accordingly, there is a considerable reduction in the costs per mm$^2$ (square millimeter) of silicon substrate. The costs for the connection of the subcircuits, for example by means of the face-to-face technology, are small compared with the cost saving as a result of the division into two processes.

The number of connections between the partial chips depends on the division. In the case of the memory circuits, the word line and bit line decoders contain logic transistors. In the case of the first exemplary embodiment explained above, both partial chips contain logic transistors. The division chosen, however, enables a simple interface with approximately 80 connections. However, the process complexity is higher than in the second exemplary embodiment.

The second exemplary embodiment involves separation through the word line section and through the bit line section. The logic transistors for the word line and bit line decoders are arranged on the logic circuit chip, whereas the high-voltage and medium-voltage transistors are arranged on the cell array substrate. The process complexity in the case of the second exemplary embodiment is considerably lower than the process complexity in the case of the first exemplary embodiment. However, more connections are required between the substrates. The second exemplary embodiment is the preferred one from the standpoint of costs. The large number of connections can be realized without any loss or with an acceptable loss in terms of the access time of the memory circuit or generally in terms of performance.

In both exemplary embodiments, however, the total costs for production are considerably less than the costs for a corresponding embedded technology. This is also true for very small chip areas, e.g. with a sum of the chip area of the two substrates of less than 5 mm$^2$.

The method can be applied not just to the separation of memory circuits but also to other circuits that have hitherto been produced only on a single substrate, for example: BICMOS circuits (Bipolar Complementary Metal Oxide Semiconductor) can be separated into CMOS circuits on one substrate and bipolar circuits on the other partial substrate, or a standalone flash can be divided into the state machine on one partial chip and the cell array and also the decoders on another partial chip.

The methods explained can be used for the production of circuits on a plurality of substrates particularly when innovative methods are used for producing a processor with minimum feature dimensions of less than or equal to 65 nm. These technologies are virtually incompatible with the requirements made of technologies for the production of flash memory circuits.

Moreover, high-voltage or medium-voltage transistors, on account of physical stipulations, cannot benefit from a reduction of the minimum feature size, that is to say that the expensive masks for producing the logic circuits would have no advantage for the production of the memory circuits. This also applies to digital signal processors in which the analog components or circuits do not benefit from the reduction of the minimum feature size for the logic circuit of the digital signal processor. These disadvantages can be avoided by virtue of the division between partial substrates.

By contrast, it is possible to produce logic transistors having threshold voltages in the lower, medium and upper voltage range, of e.g. 0.1 V (volt), 0.3 V and 0.5 V, respectively, on one substrate, e.g. on the logic substrate for the processor 40 and the coprocessor 44.

In particular, problems relating to a gate dielectric having a dielectric constant of greater than 3.9 can be solved more simply by virtue of a skillful division between a plurality of chips. In particular, problems in the chemical mechanical polishing of the stacked gate electrodes, problems in the realization of a dielectric having a high dielectric constant based on an ONO stack (oxide nitride oxide), in particular with regard to the data retention time, problems of availability of an anisotropic etching method for these dielectrics, in particular an anisotropic ion etching method, and problems in the realization of sidewall oxidation, e.g. the dielectric might crystallize.

In addition, other problems that can be solved include problems with intermetal dielectrics having dielectric constants of less than 3.9, for example the suitability thereof for higher voltages or problems when bonding onto thin interconnects situated in a dielectric having a low dielectric constant, problems with the stressing of the silicon, for example the thermal instability of the silicon that is stressed on account of an ONO method (if the top oxide of the ONO stack is replaced by a high-temperature oxide, the thermal instability of the stressed silicon on account of the sidewall oxidation, and stressing of the silicon as a result of dislocations which influence the data retention time), problems with raised source or drain zones and the associated increase in the so-called moving bit rate, and problems with SOI techniques, in particular integration on partly depleted or fully depleted SOI substrates or integration on silicon-germanium.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:

1. A memory circuit arrangement comprising:
   a cell array substrate, which has an integrated memory cell array contained in a memory circuit, the integrated memory cell array including memory cells;
   a logic circuit substrate, which has an integrated logic circuit that controls access to the memory cells, the logic circuit substrate being a different substrate than the cell array substrate;
   a main area of the cell array substrate and a main area of the logic circuit substrate lie in two planes parallel to one another and overlapping one another in a direction normal to the main area;
   wherein the logic circuit includes at least one of:
   a control circuit contained in the memory circuit, the control circuit controlling sequences when at least one of reading, writing or reading and writing content of a memory cell of the memory cell array, or a decoding circuit contained in the memory circuit, the decoding circuit selects, in a manner dependent on an address datum, a word line or a bit line connected to a plurality of memory cells of the memory cell array;

the number of connections between the substrates depends on the number of word lines and/or bitlines;

the number of connections is greater than 1000; and the cell array substrate has an analog circuit.

2. The circuit arrangement as claimed in claim 1, wherein at least one of:

the cell array substrate has substrate surfaces which surround only the cell array substrate and not the logic circuit substrate on all sides, or the memory cells are volatile or nonvolatile memory cells.

3. The circuit arrangement as claimed in claim 1, wherein at least one of:

the control circuit controls sequences when erasing the content of the memory cell, or the logic circuit substrate has a sense amplifier circuit, with the aid of which a memory state of a memory cell of the memory cell array can be determined.

4. The circuit arrangement as claimed in claim 1, wherein at least one of:

the word line is connected to memory cells of a row of memory cells of the memory cell array, the bit line is connected to memory cells of a column of memory cells of the memory cell array, or an electrically conductive connection is disposed between the cell array substrate and the logic circuit substrate for each word and bit line.

5. The circuit arrangement as claimed in claim 1, wherein the logic circuit substrate has a circuit arrangement of a processor which is suitable for processing program instructions.

6. The circuit arrangement as claimed in claim 5, wherein at least one of:

the processor comprises an encryption processor which, during operation, executes program instructions of an encryption program, or the analog circuit comprises at least one of: a voltage sensor unit, a current sensor unit, an analog-to-digital converter unit, or a digital-to-analog converter unit.

7. The circuit arrangement as claimed in claim 1, wherein the memory cell is a DRAM memory cell, a SRAM memory cell, a ROM memory cell, an EEPROM memory cell, or a flash memory cell having an ONO layer.

8. A memory circuit arrangement comprising:

a cell array substrate, which has a memory cell array that is contained in a memory circuit and that includes at least one of volatile memory cells or nonvolatile memory cells;

a logic circuit substrate that is a different substrate than the cell array substrate, the logic circuit substrate having a processor and a logic circuit that controls access to the memory cells;

a main area of the cell array substrate and a main area of the logic circuit substrate lie in two planes parallel to one another and overlapping one another in a direction normal to the main area;

wherein the logic circuit includes at least one of:

a control circuit that controls sequences when at least one of reading, writing or reading and writing content of a memory cell of the memory cell array, or a decoding circuit that selects a word line or a bit line connected to a plurality of memory cells of the memory cell array;

the number of connections between the substrates depends on the number of word lines and/or bitlines;

the number of connections is greater than 1000; and wherein the cell array substrate has an analog circuit.

9. The circuit arrangement as claimed in claim 8, wherein the cell array substrate has substrate surfaces which surround only the cell array substrate and not the logic circuit substrate on all sides.

10. The circuit arrangement as claimed in claim 8, wherein the control circuit controls sequences when erasing the content of the memory cell.

11. The circuit arrangement as claimed in claim 8, wherein the logic circuit substrate has a sense amplifier circuit, with the aid of which a memory state of a memory cell of the memory cell array can be determined.

12. The circuit arrangement as claimed in claim 8, wherein the memory circuit arrangement comprises a plurality of word and bit lines and an electrically conductive connection is disposed between the cell array substrate and the logic circuit substrate for each word and bit line.

13. The circuit arrangement as claimed in claim 8, wherein the analog circuit comprises at least one of: a voltage sensor unit, a current sensor unit, an analog-to-digital converter unit, or a digital-to-analog converter unit.

14. The circuit arrangement as claimed in claim 8, wherein the processor comprises a central processing unit and an encryption processor.

15. The circuit arrangement as claimed in claim 8, wherein the memory cell is a DRAM memory cell, a SRAM memory cell, a ROM memory cell, an EEPROM memory cell, or a flash memory cell having an ONO layer.

* * * * *

UNITED STATES PATENT AND TRADEMARK OFFICE
CERTIFICATE OF CORRECTION

PATENT NO. : 7,764,530 B2 Page 1 of 1
APPLICATION NO. : 12/258728
DATED : July 27, 2010
INVENTOR(S) : Wolfgang Gruber et al.

It is certified that error appears in the above-identified patent and that said Letters Patent is hereby corrected as shown below:

On the Title Page

Item (75), Inventors: delete "Schwelzer," and substitute --Schweizer-- in its place.

Signed and Sealed this

Sixteenth Day of November, 2010

David J. Kappos
*Director of the United States Patent and Trademark Office*